United States Patent [19]

Berger et al.

[11] Patent Number: 5,051,887
[45] Date of Patent: Sep. 24, 1991

[54] MAINTAINING DUPLEX-PAIRED STORAGE DEVICES DURING GAP PROCESSING USING OF A DUAL COPY FUNCTION

[75] Inventors: Blaine H. Berger; Bret P. Smith, both of Longmont, Colo.

[73] Assignee: International Business Machines Corporation, Armonk, N.Y.

[21] Appl. No.: 614,983

[22] Filed: Nov. 19, 1990

Related U.S. Application Data

[63] Continuation of Ser. No. 89,151, Aug. 25, 1987, abandoned.

[51] Int. Cl.[5] .................... G06F 13/00; G06F 12/00; G06F 12/16; G06F 11/14
[52] U.S. Cl. ............................ 364/200; 364/243; 364/246.6; 364/268; 364/268.1; 364/268.3; 364/268.5; 364/269.3
[58] Field of Search ............. 364/200, 900; 371/10.1, 371/10.2, 38, 68

[56] References Cited

U.S. PATENT DOCUMENTS

| | | |
|---|---|---|
| 3,336,582 | 8/1967 | Beausoleil et al. ............... 364/200 |
| 3,866,182 | 2/1975 | Yamada et al. ................... 364/200 |
| 4,053,752 | 10/1977 | DeJohn et al. .................... 364/200 |
| 4,084,231 | 4/1978 | Capozzi et al. ................... 364/200 |
| 4,099,234 | 7/1978 | Woods et al. ..................... 364/200 |
| 4,131,942 | 12/1978 | Gillett et al. ..................... 364/200 |
| 4,169,289 | 9/1979 | Shively ............................ 364/900 |
| 4,207,609 | 6/1980 | Luiz et al. ......................... 364/200 |
| 4,209,809 | 6/1980 | Chang et al. ..................... 371/10 |
| 4,241,420 | 12/1980 | Fish et al. ......................... 364/900 |
| 4,430,701 | 2/1984 | Christian et al. ................. 364/200 |
| 4,430,727 | 2/1984 | Moore et al. ..................... 364/900 |
| 4,467,421 | 8/1984 | White ............................... 364/200 |
| 4,494,215 | 1/1985 | Koike et al. ...................... 364/900 |
| 4,608,688 | 8/1986 | Hansen et al. .................... 364/200 |
| 4,625,081 | 11/1986 | Lotito et al. ...................... 379/88 |
| 4,638,424 | 1/1987 | Beglin et al. ..................... 364/200 |
| 4,654,819 | 3/1987 | Stiffler et al. .................... 364/200 |
| 4,686,620 | 8/1987 | Ng .................................... 364/200 |
| 4,745,604 | 5/1988 | Patel et al. ........................ 364/200 |
| 4,750,106 | 6/1988 | Aiken, Jr. ......................... 364/200 |

FOREIGN PATENT DOCUMENTS

156179 2/1985 European Pat. Off. .
0115121 9/1980 Japan .................................. 371/10

OTHER PUBLICATIONS

Uffenbeck, John E., "Sec. 10.4 Disk Formatting", in: Uffenbeck, John E., Microcomputers and Microprocessors (Englewood Cliffs, N.J. by Prentice-Hall, Inc. (1985)), p. 499.
"Site Recovery in Replicated Distributed Database Systems", B. Bhargava et al., IEEE, New York, May 1986, pp. 621–627.
IBM Technical Disclosure Bulletin, vol. 29, No. 11, Apr. 1987, p. 4816, "DASD Update Processing".

Primary Examiner—Thomas C. Lee
Assistant Examiner—Robert B. Harrell
Attorney, Agent, or Firm—Whitham & Marhoefer

[57] ABSTRACT

A technique is described for managing data storage devices and the data stored on them. A pair of data storage devices are maintained as identical copies. The dual copy function is provided without changing any current system or application software on the host. A set of status information is maintained for each record on the data storage devices. This status information includes information which allows only the changed records to be copied to a secondary device of the dual copy. This technique also provides high availability of data storage devices by swapping a failing data storage device with a good data storage device without host intervention. A joint array structure is used for routing host requests for information to and from the correct data storage device and keeping status information concerning the data storage devices.

7 Claims, 4 Drawing Sheets

MAINTAINING DUPLEX-PAIRED STORAGE DEVICES DURING GAP PROCESSING USING OF A DUAL COPY FUNCTION

CROSS-REFERENCE TO RELATED APPLICATION

This application is a continuation of application Ser. No. 07/089,151, filed Aug. 25, 1987, now abandoned.

BACKGROUND OF THE INVENTION

1. Field of the Invention

This invention generally relates to improvements in data storage devices for the input and output of information to a data processing system and, more particularly, to a dual copy function in a disk storage device. Each write to the primary storage device is also written to a secondary storage device. Tables are employed to manage the records to be updated and their locations on the physical medium. A status array is also employed to retain the status and device identification information on a status track of each of the data storage devices and another location to provide global identification and management of interchangeable data storage devices.

2. Description of the Prior Art

The past several years have seen the growth of on-line workstations, the evolution of distributed processing, and the acceleration of information technology in many new application areas. The result has been an increase in the use of on-line data base systems and a growth in the requirement for storage capacity and increased reliability and flexibility in data storage devices.

The concepts of self-test, redundancy, cross-check verification between various sources of information and the like are well known in the art, particularly with the advent of complex digital computer systems used for applications such as process control or supervisory control. An example of such a system is illustrated in U.S. Pat. No. 4,032,757 to Eccles, which uses a pair of channels to continually compare the events occurring in each computer. The constant comparison allows the additional processor to quickly take over control of the process if the other processor fails. The problem with this approach is the time that the extra processor needs to begin processing after a failure. In critical processes such as a nuclear power plant, any time lag could be unacceptable. Another approach is presented in U.S. Pat. No. 4,270,168 to Murphy et al., which uses a plurality of processors, self checks and joint answer checking to assure that each processor can assume real time utilization for another processor in the event of a failure. The increased reliability presented in these systems is a memory resident application approach that fails to handle a large data base application spanning many data storage devices.

The general configuration of a data processing system typically comprises a host processor or processors, a memory and various peripheral units. The peripheral units include terminals, printers, communications devices and direct access storage devices (DASD). We are concerned with the control that provides information from DASD to a data base application residing in the host processor memory. Good examples of prior art approaches to this type of processing are presented in U.S. Pat. No. 3,999,163 to Levy et al., U.S. Pat. No. 4,067,059 to Derchak and U.S. Pat. No. 4,189,769 to Cook et al. These patents present various ways to enable a host to process information residing on DASD. While production systems described readily lend themselves to data base applications, they are lacking the capability of retaining status information when a power-off occurs in an environment designed to provide high availability of DASD information.

In a known data processing system, a memory control circuit connected to each of a plurality of memory banks selectively transfers the contents of an arbitrary first one of the memory banks to a selected second one of the memory banks in a manner whereby, if a first memory bank is written into, the utilizing circuit transfers the contents into a second memory bank thereby preventing a loss of information. An example of such a system is illustrated in U.S. Pat. No. 3,866,182 to Yamada et al.

SUMMARY OF THE INVENTION

It is therefore an object of this invention to provide a method for improved management of data storage devices and the data stored on them.

It is another object of the invention to provide a technique which maintains synchronization between a first and a second data access device.

It is a further object of the invention to provide a set of tables to indicate which records to update.

It is another object of the invention to uniquely identify fields on data access devices for the purpose of duplicating the fields to another medium.

It is another object of the invention to provide the foregoing capabilities without changing current software applications on the host.

It is another object of the invention to provide the foregoing capabilities without impacting performance of the data storage device.

It is yet another object of the invention to provide high availability of the data storage devices.

According to the invention, these objects are accomplished by providing a method of uniquely identifying fields on a data storage device for the purpose of duplicating the information to another medium. Primary and secondary data storage devices are also used to implement the dual copy environment. A management facility is used to update the secondary device with only the fields that have changed on the primary device. A method of employing the data storage devices to keep important status information nonvolatile for integrity purposes is also employed.

BRIEF DESCRIPTION OF THE DRAWINGS

The foregoing and other objects, aspects and advantages of the invention will be better understood from the following detailed description of the preferred embodiment of the invention with reference to the accompanying drawings, in which.

DESCRIPTION OF THE PREFERRED EMBODIMENT OF THE INVENTION

The following disclosure describes a method for improved management of data storage devices and the data stored on them. Status and identification information is retained on the data storage devices and a backup medium to assure the retention of information when a power out or other disablement of the devices occur and to verify that the correct physical devices are still attached to the controllers when the data storage device resumes operation.

Figure 1:
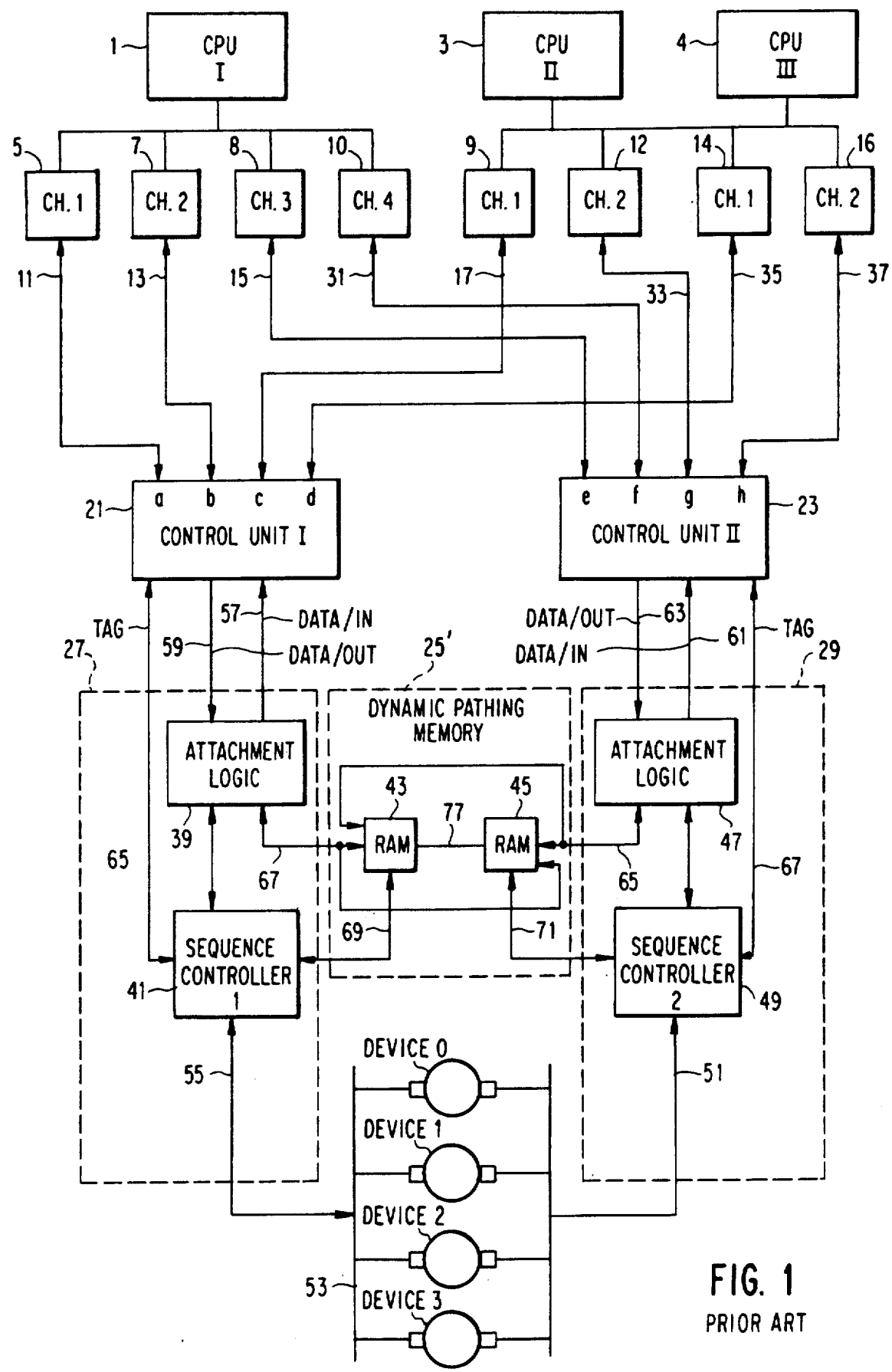
FIG. 1 is a block diagram showing a prior art data storage system of U.S. Pat. No. 4,207,609.

Referring now to the drawings, and more particularly to FIG. 1, there is depicted a typical prior art data storage system. FIG. 1 shows a multi-CPU and shared DASD configuration according to U.S. Pat. No. 4,207,609 assigned to the assignee of this invention. Three CPU's 1, 3, and 4 hereinafter designated by Roman numerals respectively CPU I, CPU II and CPU III, are suitably cross-connected to a pair of control units 21 and 23, hereinafter designated CU I and CU II over counterpart channels. In this regard, CPU I attaches four channels 5, 7, 8 and 10 to control units CUI and CUII; CPU II attaches two channels, 9, 12 to control units CUI and CUII, and CPU III attaches two channels 14 and 16 to control units CUI and CUII. Channels 1 and 2 of CPU I terminate in CU I ports a and b, while channels 3 and 4 of CPU I terminate in CU II ports e and f. Channel 1 of CPU II terminates in CU I port c, and channel 2 of CPU II terminates in CU II at port g. Lastly, channel 1 of CPU III drives port d of CU I with channel 2 of CPU III driving port H of CU II. CU I and CU II attach devices 53 through DASD controllers 27 and 29 over a demand/response interface embracing tag and data lines. The interface between CU I and DASD controller 27 includes tag lines 65 and data/in and data/out lines 57 and 59, respectively. Likewise, tag line 67 and data/in and data/out lines 61 and 63 couple CU II to DASD controller 29.

The demand/response type interface is one in which the tag out identifies and validates the information on the data line out and vis-a-vis. In this regard, each CPU/control unit/device operates asychronously with respect to one another in which directional control is asserted from the top down. Active connection between elements for executing operations is necessary for extended periods only with respect of the movement of data from device to channel or from channel to device. Otherwise, tasks or operations may be performed in disconnect mode.

Devices 53 are accessed either through DASD controller 27 or DASD controller 29. DASD controller 27 includes attachment logic 39 and sequence controller 41 coupling devices 53 over path 55. Similarly, DASD controller 29 includes attachment logic 47 and sequence controller 49 to operate devices 53 over path 51.

Between the DASD controllers 27 and 29, there is juxtaposed dynamic pathing memory 25'. This memory contains the map of network topology and the necessary context information utilized by the CU's in managing the connection between CPUs to devices. Memory 25' comprises a pair of random access memories (RAM) 43 and 45 which can be commonly accessed by either CU through the appropriate attachment logic. CU I can access for reading, writing or updating purposes RAMs 43 and 45 through attachment logic 39 and path 67. CU II can commonly access the RAMs over attachment logic 47 and path 65. The operations concerned with accessing of devices 53 involving the dispatching and positioning of electromechanical elements such as the head disk arm assembly on direct access storage devices 0–4 is regulated by the commands and parameters sent from the control unit through the attachment logic and sequence controller. An example of the host CPUs is the IBM 3090 processor. The IBM 3090 is a compatible growth system which uses either Multiple Virtual Storage/Extended Architecture (MVS/XA) or Virtual Machine (VM) operating systems. The operating system controls the flow of data to/from main storage and provides an application environment which is System/370 compatible. The IBM 3090 processor is described in more detail in IBM publication, 3090 *Processor Complex Installation Manual—Physical Planning*, GC22-7074. An example of a DASD controller 27 and 29 is the IBM 3880 model 23 DASD controller. The IBM 3880 model 23 contains a high speed cache and two storage directors 41 and 49, each with a single storage path for independent control of attached DASD devices 53. The IBM 3880 model 23 controller is described in IBM publication, *IBM 3880 Storage Control Model 23 Description*, GA32-0082. A good example of a DASD devices 0–3 are the IBM 3380 storage devices, which provides a fixed-medium head and disk assembly (HDA) that contains the heads, disks and access mechanisms (actuators) within a sealed enclosure. Each 3380 unit contains two HDAs. There are two independent, movable actuators within each HDA. Each actuator has its own address which is selectable from the CPUs. A string of DASDs attached to a 3880 storage director can contain four units (sixteen actuators). A more detailed description of the IBM 3380 DASD is found in IBM publication, 3380 *Description and User's Guide*, GA26-1664.

To understand the subject invention, it will be necessary to discuss some of the details of the prior art DASD system operation. When the host CPU requires information, it requests it by requesting a specific channel, controller and DASD actuator. The channel number is a one byte hexadecimal number, the controller number is a four bit hexadecimal number and the DASD actuator number is a four bit hexadecimal number. For example, if the host sent a two byte hexadecimal address 0111 in a start input/output (I/O) operation then actuator one, attached to controller one, attached to channel one would prepare for an I/O operation and send the host CPU a ready signal. Since the mapping down and back is the same, the original transaction header can be used to determine the path back to the host. Any host program accessing the DASD could send the header described above to uniquely define the DASD actuator to access.

Figure 2:
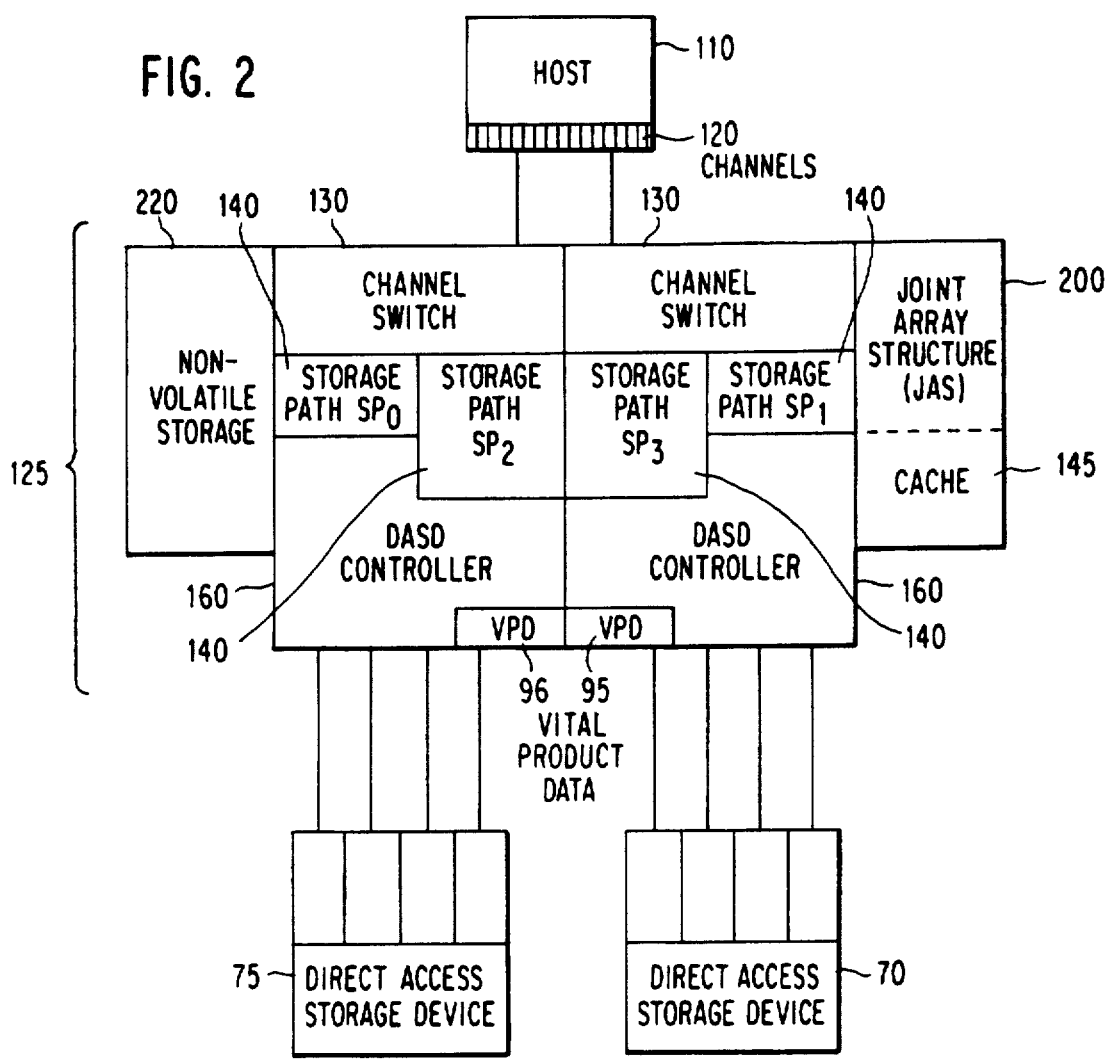
FIG. 2 is a block diagram showing the basic elements of the new data storage system.

Referring now to FIG. 2, a diagram showing the basic elements of the new data storage system is shown. The basic structure is very similar to FIG. 1. A host CPU 110 is attached via its channels 120 to a, including dual DASD controllers 160 and 160', controller 125 which is attached to DASDs 70 and 75. Information is passed through the described path to the host. A major difference between the prior art and the invention is the subsystem status which contains information used to manage the data storage system and the nonvolatile storage 220. The DASD controller 160 also contains an EPROM vital product data area at 95. The vital product data area contains pointers to the global status track.

The joint array structure (JAS) 200 is used to conserve the host to DASD interface and implement the dual copy, high availability functions. The dual copy function provides enhanced data availability and reliability by maintaining two identical copies of volumes, called a duplex pair, on two physically separated DASD units as, for example, a primary data storage device 70 and a secondary data storage device 75. The dual copy has a first copy of the data which is referred to as a primary copy and a second copy which is referred to as a secondary copy.

Once the duplex pair is established, the DASD controller 160 provides an image of the duplex pair using control information kept in the JAS 200 as a single highly available volume. Both volumes of the duplex pair are updated as a result of a single write request. A single read request to a dual copy data storage device is handled in accordance with normal cache algorithms unless the data is not in the cache in which case the controller attempts to read the data from the primary device. Reads which fail on the primary device are attempted on the secondary device of the duplex pair.

The other feature that is unique to this invention is the nonvolatile storage 220. The dual copy function requires the nonvolatile storage 220 for operation. The nonvolatile storage is used to hold transferred data so that the subsystem can signal completion of a write operation before the actual write to DASD transpires. This feature also provides information necessary for re-synchronizing two volumes of a dual copy pair when a failure is repaired.

Figure 3:
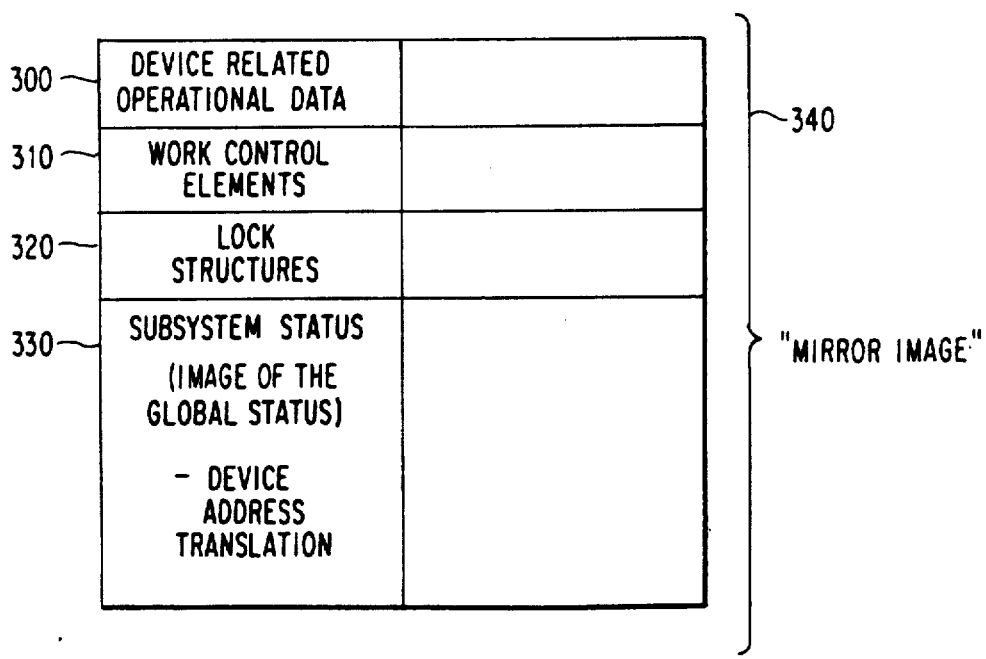
FIG. 3 is a block diagram showing the parts of the joint array structure.

The JAS 200 conserves the host interface by translating the standard host header described above in the prior art illustrated in FIG. 1 into the actual physical DASD actuator through the use of a pair of translate tables. The first table is used to translate the actuator address and the second table is used to translate the return host address. The structure of the joint array is shown in FIG. 3. The joint array structure comprises a sixty-four byte area to support device address translation. The JAS 200 also contains device related operational data 300, work control elements 310, lock structures 320 and subsystem status information 330.

Figure 4:
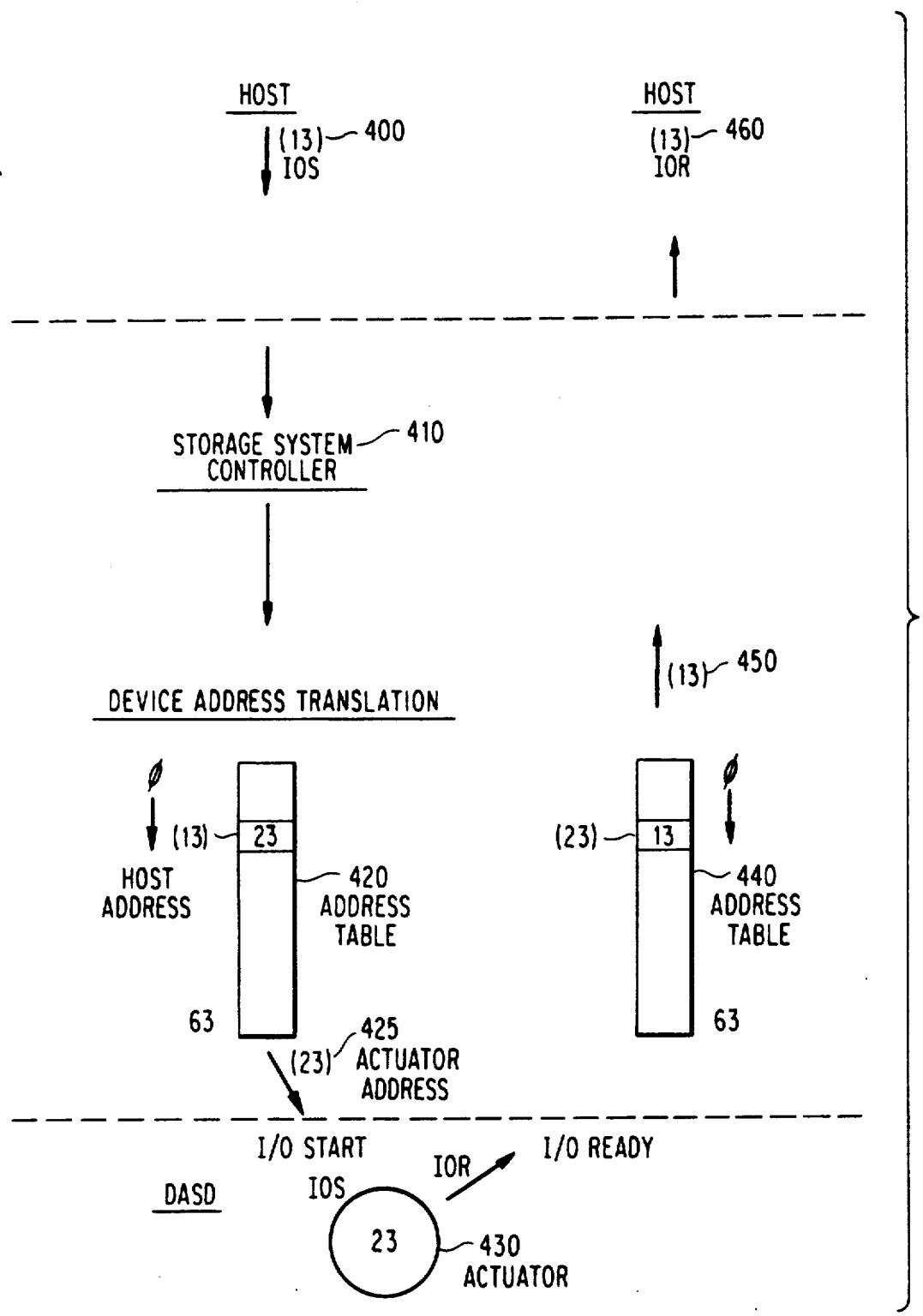
FIG. 4 is a flow diagram showing the flow of a data storage request from the host to the storage system and back.

A mirror-image of the control and status information listed above is contained in the other half 340 of the JAS 200 for redundancy. The subsystem status information 330 includes the global status and the device address translation. The device address translation provides the address lookup capability necessary to conserve the system interface and still take advantage of the dual copy feature, nonvolatile storage and global subsystem status. An example will help to clarify the usage of the address translation table. In FIG. 4, a host application has requested an I/O start of actuator thirteen 400. This request goes out over the channel to the storage system controller 410 where the thirteenth byte of the sixty-three byte address table 420 is accessed to obtain the actual address of the actual actuator that host address thirteen is mapped to. Twenty-three is the actual actuator address as shown at 425, so actuator twenty-three is prepared for I/O and returns an I/O ready signal at 430. However, to determine where to send the signal, it is necessary to look up the return address in the return address table of the data address translation at 440. The return address is thirteen as indicated at 450, and this value is used to return the I/O ready to the host at 460. The use and initialization of the device address translation tables is presented in more detail below.

To understand the method better, a preferred embodiment is described employing the environment presented in FIG. 2. A first data storage device 70 and a second data storage device 75 each have a dedicated status track for the retention of status information. The dedicated status track is unusable by non-system applications and retains two copies of the global subsystem status for the controller and the first and second data storage devices. The storage subsystem is the set consisting of the controller and the attached data storage devices. In the example, this consists of the controller 125 and the two data storage devices 70 and 75.

Status information about the subsystem is retained across power downs by writing a single record of status and identification information twice on the status track of each device. Global subsystem status is also kept on the first and second data storage devices 70 and 75. Device identification is kept on all the devices in the subsystem, but global subsystem status is only kept on the two global data storage devices. The global subsystem status portion of the record is formatted but not used if the device is not one of the two global subsystem status devices.

The global status pointer contains address information about the two data storage devices and a count of how many times the devices have been reassigned, which is used at initial program load to determine which is the most current copy of the global status pair. A more detailed description of the global status pointer is provided below.

The global subsystem status consists of the following information:

The global status pointer which is a four byte field including the one-byte address of each of the data storage devices including the first 70 and second 75 global data storage devices and a two-byte number which indicates the number of times the definition of the data storage devices have changed. Global status contains the status of the subsystem components, a cache store 145 and a nonvolatile storage 220, and devices 70 and 75 as established by failure or system commands.

Information on the status track is divided into device identification and status information. Device identification information is used to insure that the DASD device attached is the one that the subsystem expects. The status information is divided into two types: subsystem status and device status. Subsystem status contains information that pertains to the entire subsystem rather than to a specific device such as the global status pointer, whether the subsystem storage is available or not and information to help insure the integrity of the nonvolatile store. The device status contains information that pertains to a specific DASD device such as the channel address that the device will respond to, whether the device is active for cache or fast write or not, and the duplex pair status of the device. Other information is included with the status track. The above are examples of the information identified.

The global subsystem status information discussed above is kept on two devices for availability reasons. However, each device has its device number written. If one device should fail, then the other will be used to keep the information and the failed device will be replaced by another operational device.

Each controller 160 and 160' has vital product data that is maintained and used to identify and establish information concerning the hardware characteristics of the attached devices. The vital product data is stored in EPROM in each controller as depicted at 95 and 96 of FIG. 2.

The information includes:
Model type
Configuration
System Adapter and System Address
Subsystem Storage Identification
Storage Control Serial Numbers
Subsystem Storage Size
Nonvolatile Storage Size
Global Status Pointer
Controller Type For Each String
Maximum Number of Drives Configured For Each String This information is used to initialize the JAS 200 in the controller 125 to reflect the current system's configuration. In our example, the JAS 200 contains the addresses that data storage device 70 and data storage device 75 are known to the host 110.

When the subsystem is initialized, the following steps are performed:

The devices undergo an initial microprogram load (IML) to establish an operational data storage paths $140_0$, $140_1$, $140_2$, and $140_3$ between the attaching channels and the attached devices. The Storage Path (SP) microcode is loaded from the IML device by the support facility in the data storage device. A SP $140_i$ is an addressable, independent processor that routes data to a data storage device 70 or 75. A basic assurance test routine is run to insure that the storage path is operational. This process is coordinated for all of the SPs $140_i$ in the subsystem residing on the controller 125. Each SP $140_i$ can complete IML independent of the other SPs. The location of a global status device is required before access is permitted. If an IML device pointer is available, the most recent pointer must agree with the available device or devices. If more than one IML device pointer are available, it must point to one device with identical pointers. The IML device pointer does not have to be identical t the device pointer.

Then, the global subsystem status array is read from each of the two global subsystem data storage devices 75 and 70. When valid and current global subsystem status is identified, the global subsystem status is written to both data storage devices to insure the information is consistent on both of the devices. As devices become available, the device number and subsystem identification number of each data storage device is read and checked against the global status array to ensure that the correct hardware is attached and no movement has occurred. When this process is completed, the host is notified of the available SPs $140_i$ and normal processing commences. Device identification is verified to assure that data left in the nonvolatile store for a device is not applied to the wrong device because of a device reconfiguration as a result of device replacement, for instance.

If the current device availability allows a better global subsystem status device configuration, the devices will be reconfigured following these rules:
1) put the devices on separate strings;
2) put the devices on separate units; and
3) put the devices on separate spindles.

The global subsystem status devices are also reassigned by the controller when the controller can only access one of a pair of devices. If it is necessary for any of the reasons described above to reconfigure the system, the order of update will be as follows:

1) Increment the reconfiguration count in the global status pointer to show a reconfiguration has taken place.
2) Global subsystem status will be written to the new global status device. Its status will reflect the new pair.
3) The global subsystem status will be written to the old but still working global status device (in the case of the malfunctioning unit).
4) The global status pointer will be updated in both EPROM vital product areas 95 and 96.

The reconfigured system will be optimally tuned and ready for use when the operations described above are completed.

In operation, if either the primary or the secondary data storage device begins to show signs of failure, the controller will replace the failing device and copy the global status to another data storage device. Then, that data storage device's address will be substituted into the device address translation of the JAS 200 as the secondary storage device for the dual copy, and the system will continue to process with minimal impact to the host.

Four data storage device states are defined with respect to the dual copy function:

Simplex or "single copy" volume. The data storage device is treated as though it were attached to a subsystem which does not provide the dual copy function. No secondary data storage device is maintained. All read/write activity accesses the addressed data storage device only.

Duplex or "two copy" volume. The two volumes, primary and secondary, are identified as a duplex pair. Only the primary data storage device is directly accessible by the host systems. The secondary data storage device rejects all direct host calls except error diagnostics.

Duplex Pending is a temporary state. The two volumes, primary and secondary, are identified as a duplex pair and the subsystem carries out a -copy to synchronize the two devices. Only the primary data storage device is directly accessible by the host systems. The secondary data storage device rejects all direct host calls except error diagnostics.

Failed Duplex is an error state. The two volumes, primary and secondary, are identified as a duplex pair. Either an attaching host system has requested that the subsystem should not continue duplicate writes for this duplex pair or the controller has determined that it was unable to synchronize the contents of the two volumes and has suppressed duplicate writes. In this state, a bit map is maintained in nonvolatile storage to track the cylinders written in this mode. The subsystem will begin recovery operations as described above when this state is detected.

Once the duplex pair is in the full duplex mode, the controller ensures that the two volumes are identical by updating both volumes as the result of any write issued to the primary data storage device of the pair. This duplicate write is transparent to the attaching host systems. The duplicate update is accomplished by orienting the primary data storage device and performing a branching write, updating the primary data storage device and capturing only the data necessary to duplicate the write to the secondary data storage device.

To update only the changed fields on the primary data storage device, a method for uniquely defining fields on a data storage device is employed. The method identifies any changed fields on the data storage device. As the data storage device spins, the read/write head of the disk drive encounters fields and small gaps between the fields. All processing must be accomplished during these gaps between the fields; otherwise, unnecessary revolutions of the device (overruns) occur which degrade the performance.

Each record stored on the data storage device has a unique identifier. It is called the cell number. Record identifications can be duplicated on the track, so they will not identify a particular record. The cell number is the exact location of the count field on the drive's track. Each record contains three fields: Count, Key and Data. The cell number is stored in the count field. The count field is two bytes long.

As the device spins, the count fields are encountered for every record on the track. Every cell number from each count field is pushed onto a stack in the controller. The three high order bits in the cell number are modified or set depending on which type of write operation is requested by the channel or the host. An example of one element of the cell number stack is provided below.

| C | K | D | Cell Number (13b) | Reserved (4b) |

The C bit of an element on the cell number stack is the count bit, the K bit is the key bit, and the D bit is the data bit. The cell number is a thirteen bit field which specifies the unique record on the data storage device. The reserved 4 byte area is for future enhancements. When either the C, K or D bit is on, the record is copied to the secondary data storage device.

Format writes always modify the count fields and set the count C bit. Key and data fields are occasionally modified resulting in their bits being set. For example, update writes never modify count fields but will change key and/or data fields. This information is set in the cell number on the data storage device and copied to the stack in the controller. This stack provides all the information to copy all the modified fields on the primary device to the secondary device.

Figure 5:
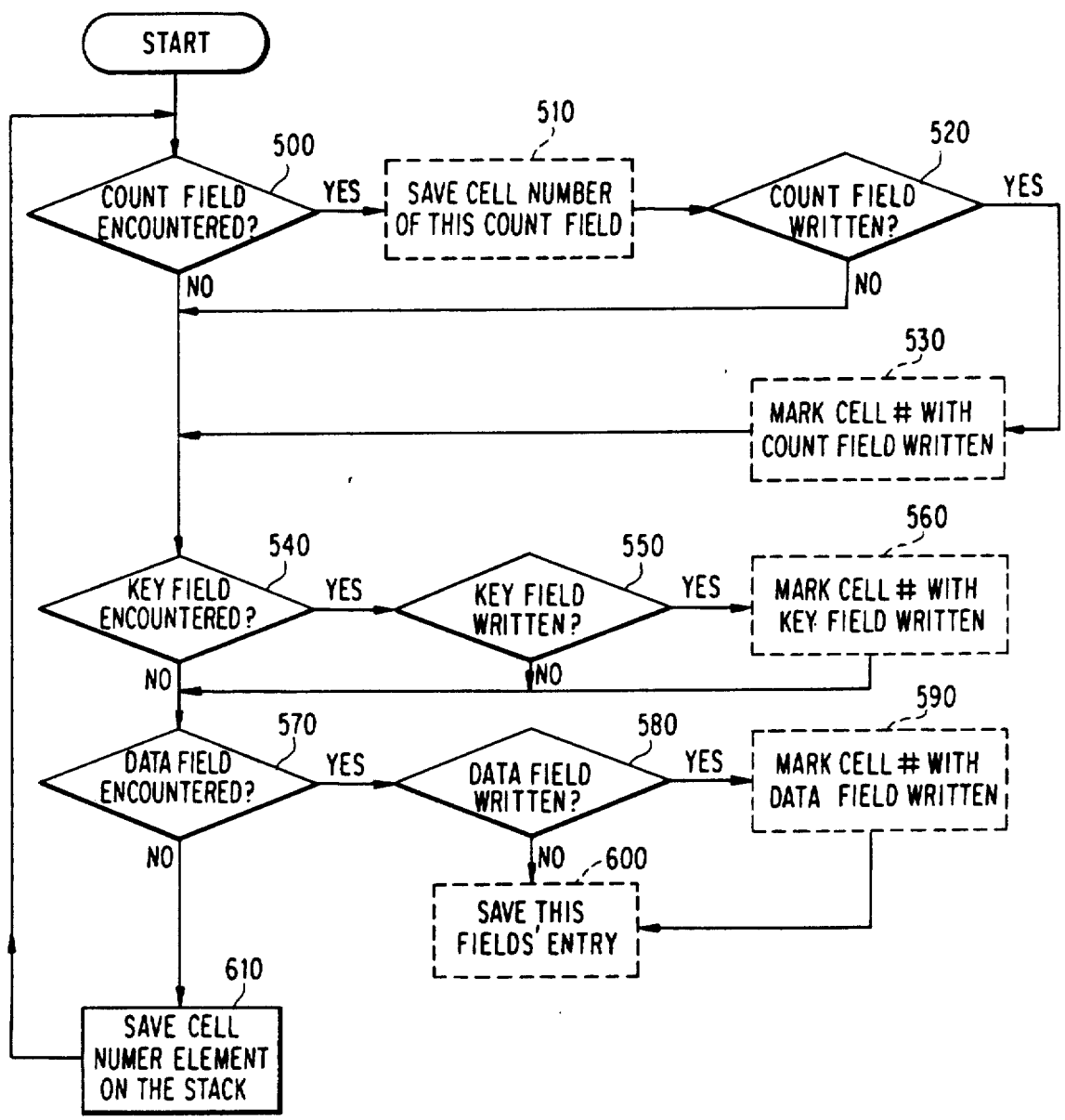
FIG. 5 is a flow diagram showing the creation of the cell number stack in controller storage.

The method for creating the cell number stack in the controller is shown in the flow diagram of FIG. 5. While the stack is created in controller memory in this embodiment, those skilled in the art will recognize that it could be maintained in any memory area. Referring now to FIG. 5, control enters at decision block 500 where a test is performed to determine if a count field has been encountered on the data storage device. Then, at function block 510, the cell number of the count field is temporarily stored. A test is performed at decision block 520 to determine if the count field was written to the data storage device. If it was written, then the cell number's count bit is set on at function block 530.

Next, control flows to decision block 540 where a test is performed to determine if a key field has been encountered. If a key field has been encountered, then a second test is performed at 550 to determine if the key field was written to a data storage device. If it was written, then the cell number's key bit is set on at function block 560.

Next, control flows to decision block 570 where a test is performed to determine if the data field has been encountered. If a data field has been encountered, then a second test is performed at decision block 580 to determine if the data field was written to a data storage device. If it was written, then the cell number's data bit is set on at function block 590. Whether the data field was written or not, the field's entry is saved at function block 600. The cell number information is stored on the stack at function block 610.

The controller manages the identification and copying of the changed information to the secondary data storage device. The modified records are copied from the cache to the secondary device. While the transfer of information is from cache to secondary storage, one of ordinary skill in the art will recognize that any medium can be used for storage of the information that has been changed, including the primary data storage device. After the transfer of information to the secondary data storage device, the controller sets a status indicating that it is available for further processing.

The duplex pending state of the dual copy looks the same to the attached host. Input/Output (I/O) requests to the data storage device will be handled the same as in Duplex with the following exceptions:

1) The device being copied from will be the one that I/O is performed on (the logical primary), whether it is the primary or the secondary device.
2) If the I/O is a write and it is to a track that has already been copied, it will be treated the same as in Duplex, except that the device being written to first is the device being copied from.
3) If the I/O is a write and it is to a track that has not been copied, then only the copied device from will be updated. The copy will update the copies device to when it reaches that track.
4) Recovery of the failed reads from the logical secondary will only be attempted if that track has already been copied.
5) Fast write will not be performed until after the copy is complete.

When a duplex pair is established, the primary device in the pair is forced into fast write deactivated state. If fast write is desired, it can be specified after the duplex pair is established. If the primary device has fast write activity, then the pair will be in fast write mode. On cache misses, the normal dual copy algorithm will be used. On cache hits the following procedure is performed:

1) The data from the host will be written to the subsystem storage and the nonvolatile storage.
2) Device end will be immediately presented to the host, however the device will remain busy until the data is destaged to the primary device.
3) The data in the nonvolatile storage will represent the data on the secondary device.
4) If the secondary fails, all fast write entries in the nonvolatile cache are freed and all cylinders that have entries on the nonvolatile cache are marked as out of synchronization. Fast write will be inactive for further activity on the volume.
5) If the primary fails, then the entries in the nonvolatile cache are immediately destaged to the secondary. Fast write will be inactive for further activity on the volume.

The controller assures high availability by maintaining two copies of every piece of information stored. If either the primary or the secondary data storage device fails, the controller can efficiently replace the faulty device, copy the information from the working data storage device, and bring the dual copy back into synchronization without any loss of information.

The performance benefits of write operations with cache are limited to operations where the data exists in the cache. Generally, all data in write operations goes directly to the data storage device as well as cache in order to keep the data current on a nonvolatile media. Fast write extends the performance benefits of caching to write commands without impacting the reliability or availability of the accessed data. Without fast write, writes require a data storage device access to ensure that the data stored as a result of the write request will not be lost as a result of a loss of power to the controller.

In order for fast write to function, the following environment must exist:
1) Nonvolatile storage must be available in the controller.
2) Subsystem storage must be available.
3) Caching must be active.
4) Fast write must be active for the device.
5) The data storage device must have a standard format. Specifically, it must have standard record lengths (record zeros), and it must have unique record identifications.

Fast write applies to all write hits and predictable writes. A write hit involves encountering a set of records that are already in cache in their updated form. A predictable write is a write which only requires the preformatted portion of the track (header and record zero) and does not require user data. Fast write is not applied to cache misses because commands are not guaranteed to be predictive (imbedded error situations can occur). Embedded error situations must be detected and reported prior to the completion of the activity of the commands since they will typically affect the function that should be performed. As an example, prior to indexed volume tables of contents (VTOC) support, insertion of a new data set on a volume involved execution of a command which would search the entire VTOC looking for a data set which had a name the same as the data set to be added. If such a duplicate data set name is found, the new data set is not added; otherwise, the new data set is added by a subsequent command. The command which searches for the duplicate data name relies on a No Record Found to indicate that no duplicate exists. For this case, No Record Found must clearly be reported synchronous to the execution of the commands.

Additionally, for some commands, the count field for a record must be examined in order to determine the key and data lengths of accessed records. The data contents of an accessed track must be examined in order to determine what activity should be performed by the command accessing the track.

Fast write extends to writes the performance benefits that caching has provided for reads. This results in significant improvements in both throughput capability and response time. The data integrity, data availability and data serviceability are maintained for the fast write system. No host software changes are necessary to implement the fast write function.

Fast write uses a nonvolatile storage array to assure the integrity of data without performing an actual write to a data storage device. Each data modification is stored in two locations in the controller until the actual data storage device update takes place. One copy is maintained in the controller storage, the other in the nonvolatile storage. Two copies of the data are essential in order to maintain data availability comparable to that of standard data storage devices. There are failures within the controller which can make the nonvolatile storage or the subsystem storage unavailable to the subsystem. If the subsystem only maintained one copy of data modifications, any failure which made the array containing that data unavailable would compromise the data's integrity.

The fast write is accomplished by performing a branching write, updating the nonvolatile storage and the images in the cache simultaneously as a result of a single transfer of data from the channel to the controller. Fast write is allowed only if an image of the track is in cache or if the operation is a predictable write. If an image of the track is in cache, the cache space is previously allocated but may have to have additional segments allocated for format write operations.

A clean final status (channel end and device end) is sent as soon as the data transfer to the cache and nonvolatile storage is successfully completed. This status is a commitment by the controller that the data is successfully stored in the controller and will be available for any later reference.

Data movement from the cache/nonvolatile storage to the data storage device occurs as a result of an internal controller that performs anticipatory destaging. Anticipatory destaging is designed to avoid an instance of a write request being delayed because there is not space available for allocation in either the nonvolatile storage or the cache. Anticipatory destaging maintains a buffer of unmodified space in both the nonvolatile storage and the cache. Space in these buffers is immediately available for allocation to satisfy requests to the controller. The amount of available space maintained in each of the buffers is such that concentrated bursts of activity which require space allocation would rarely result in a write being delayed by space allocation. Should such delays be necessary, destaging will take priority over other internal subsystem activity until the need for the delay is eliminated.

Unlike the general replacement algorithm for the cache where the least recently used (LRU) information is replaced, the destage candidate selection algorithm is a first written, first replaced algorithm. This algorithm is based upon two elements of nonvolatile space management. First, the nonvolatile storage is managed as a circular buffer. When space is needed for allocation, it is allocated immediately in front of a free space pointer. Another pointer indicates the oldest valid data in the buffer (the valid data located the closest in front of the free space pointer). As long as the indicated data transfer can reside in the space between these two pointers, allocation occurs and the transfer begins. Anticipatory destaging attempts to maintain the amount of free space at some predefined value. Second, the nonvolatile storage treats currently allocated space as home areas for any new modifications to the data (records) in that space. If a modification is to be made to a record, allocation determines if an entry for that record exists in the nonvolatile storage. If it does and the record is not being reformatted, the update occurs to the preallocated nonvolatile storage space. If no allocation exists or if the record is being reformatted, then new space is allocated, the update occurs to this space and the old space occupied by the record is indicated as not containing valid data.

Once a destage candidate has been selected, the controller is examined to determine if any other modifications for the same track are present. If there are other modifications, the complete set of updates to the track are made as a result of the destage for the selected candidate.

Fast write is transparent to the host application. The controller manages the nonvolatile storage and data movements between the cache and the data storage device without any host involvement. The controller also handles the error recovery and status logging facilities.

While the invention has been described in terms of a preferred embodiment in a specific operating system environment, those skilled in the art will recognize that the invention can be practiced, with modification, in other and different operating systems within the spirit and scope of the appended claims.

What is claimed is:

1. In a data processing system of the type comprising a host computer having a plurality of input/output channels, a direct access storage device controller connected to input/output channels of said host computer, and two strings of direct access storage devices connected to said direct access storage device controller, said direct access storage device controller having a memory and channel switches and storage paths, said channel switches and storage paths establishing paths between said connected input/output channels and said direct access storage devices, each direct access storage device in each of said strings having rotating recording media characterized by having a plurality of tracks on which are recorded a plurality of records, each record containing a count field and a plurality of additional fields, said fields being separated by small gaps, each record being identified by a cell number which designates an exact location of the count field for that record on a track, said direct access storage devices further including a head positioned by an actuator responsive to said direct access storage device controller for reading and writing data of said records in response to requests from said host computer, the improvement in said direct access storage device control whereby duplex-paired storage devices are maintained during gap processing by a dual copy function performed by said direct access storage device controller transparently to said host computer, said direct access storage device further comprising:

means for selecting two of said direct access storage devices as said duplex-paired storage devices, a first one of said direct access storage devices being designated as a primary storage device and a second one of said direct access storage devices being designated as a secondary storage device, said primary and secondary storage devices being physically separated but substantially identical in configuration and type;

means for synchronizing said secondary storage device with said primary storage device;

a plurality of bits of each of said cell numbers of records on said primary storage device being designated to indicate a status of a corresponding one of said count field and said plurality of fields which comprise each of said records as modified or unmodified as a result of a write operation to a record on said primary storage device;

means for setting the corresponding one of said plurality of bits to indicate a modified status when one of said count field or said plurality of fields which comprise a record is modified by a write operation to said record on said primary storage device;

means for storing modified records in said memory;

said head accessing the records on said primary storage device in sequence and means responsive to records accessed by said head for searching for a count field for each of said records;

when a count field for a record is encountered by said means for searching, said means for searching further saving in said memory the cell number from the count field for the record;

means for identifying by cell number saved in memory each record on said primary storage device containing a field that has been modified as indicated by one of said plurality of bits having been set, said step of identifying being performed during time periods corresponding to said gaps between fields; and means for transferring from said memory to said secondary storage device only those fields updated on said primary storage device in said identifying step thereby maintaining on said secondary storage device an exact duplicate of records stored on said first storage device without degrading the performance of said data processing system.

2. The improvement in said direct access storage device as recited in claim 1 wherein said memory includes a cache, said modified records being stored in said cache by said means for storing and transferred from said cache to said secondary storage device by said transferring means.

3. The improvement in said direct access storage device controller recited in claim 2 wherein said memory further includes nonvolatile storage for storing information necessary for re-synchronizing said primary and secondary storage devices in the event of a failure of said duplex-paired storage devices, said means for synchronizing accessing said nonvolatile storage during a re-synchronization process.

4. In a data processing system of the type comprising a host computer having a plurality of input/output channels, a direct access storage device controller connected to input/output channels of said host computer, and two strings of direct access storage devices connected to said direct access storage device controller, said direct access storage device controller having a memory and channel switches and storage paths, said channel switches and storage paths establishing paths between said connected input/output channels and said direct access storage devices, each direct access storage device in each of said strings having rotating recording media characterized by having a plurality of tracks on which are recorded a plurality of records, each record containing a count field and a plurality of additional fields, said fields being separated by small gaps, each record being identified by a cell number which designates an exact location of the count field for that record on a track, said direct access storage devices further including a head positioned by an actuator responsive to said direct access storage device controller for reading and writing data in said records in response to requests from said host computer, a method of maintaining duplex-paired storage devices during gap processing by a dual copy function performed by said direct access storage device controller transparently to said host computer, said method comprising the steps of:

selecting two of said direct access storage devices as said duplex-paired storage devices, a first one of said direct access storage devices being designated as a primary storage device and a second one of said direct access storage devices being designated as a secondary storage device, said primary and secondary storage devices being physically separated but substantially identical in configuration and type;

synchronizing said secondary storage device with said primary storage device;

a plurality of bits of each of said cell numbers of records on said primary storage device being designated to indicate a status of a corresponding one of said count field and said plurality of fields which comprise each of said records as modified or unmodified as a result of a write operation to a record on said primary storage device;

setting the corresponding one of said plurality of bits to indicate a modified status when one of said count field or said plurality of fields which comprise a record is modified by a write operation to said record on said primary storage device;

storing modified records in said memory;

accessing the records on said primary storage device in sequence and searching for a count field for each of said records;

when a count field for a record is encountered, saving in said memory the cell number from the count field for the record;

identifying by cell number saved in memory each record on said primary storage device containing a field that has been modified as indicated by one of said plurality of bits having been set, said step of identifying being performed during time periods corresponding to said gaps between fields; and transferring from said memory to said secondary storage device only those fields updated on said primary storage device in said identifying step thereby maintaining on said secondary storage device an exact duplicate of records stored on said first storage device without degrading the performance of said data processing system.

5. The method recited in claim 4 further comprising the steps of:

responding to a read request from said host computer by attempting to read data from said primary storage device; but if a failure in reading data from said primary storage device is detected, then reading corresponding data from said secondary storage device.

6. The method recited in claim 4 further comprising the steps of:

detecting a failure in either said primary or secondary storage devices;

selecting another one of said plurality of direct access storage devices for said duplex-paired storage devices; and substituting the selected one of said plurality of direct access storage devices for the failed one of said primary or secondary storage devices.

7. The method recited in claim 4 wherein the step of selecting is performed by selecting said primary and secondary storage devices to be on different ones of said two strings of direct access storage devices.

* * * * *